(12) United States Patent
Yin

(10) Patent No.: US 11,936,967 B2
(45) Date of Patent: Mar. 19, 2024

(54) IMAGE ACQUISITION SYSTEM, MATRIX IMAGE ACQUISITION SYSTEM AND MATRIX IMAGE PROJECTION SYSTEM

(71) Applicant: TOPLITE INTERNATIONAL CO., LIMITED, Hong Kong (CN)

(72) Inventor: Yongjian Yin, Guangzhou (CN)

(73) Assignee: TOPLITE INTERNATIONAL CO., LIMITED, Hong Kong (CN)

( * ) Notice: Subject to any disclaimer, the term of this patent is extended or adjusted under 35 U.S.C. 154(b) by 324 days.

(21) Appl. No.: 17/368,514

(22) Filed: Jul. 6, 2021

(65) Prior Publication Data
US 2021/0360129 A1 Nov. 18, 2021

Related U.S. Application Data

(63) Continuation of application No. PCT/CN2019/093782, filed on Jun. 28, 2019.

(30) Foreign Application Priority Data

Jan. 4, 2019 (CN) .......................... 201910007152.7

(51) Int. Cl.
*H04N 23/54* (2023.01)
*H01L 27/146* (2006.01)
(Continued)

(52) U.S. Cl.
CPC ....... *H04N 23/54* (2023.01); *H01L 27/14621* (2013.01); *H01L 27/14625* (2013.01);
(Continued)

(58) Field of Classification Search
CPC ........ H04N 23/54; H04N 23/16; H04N 23/55; H04N 25/76; H04N 23/10; H01L 27/14621; H01L 27/14625; G02B 2027/0134
(Continued)

(56) References Cited

U.S. PATENT DOCUMENTS

| 6,292,634 | B1 | 9/2001 | Inaba |
|---|---|---|---|
| 2005/0073603 | A1 | 4/2005 | Feldman et al. |

(Continued)

FOREIGN PATENT DOCUMENTS

| CA | 2791617 | 5/2013 |
|---|---|---|
| CN | 1243267 | 2/2000 |

(Continued)

OTHER PUBLICATIONS

Yu, Q. et al., "Camera and Lens," China Media University Press, May 31, 2014, pp. 161-162 (with English translation).

(Continued)

*Primary Examiner* — Yosef K Laekemariam
(74) *Attorney, Agent, or Firm* — Hamre, Schumann, Mueller & Larson, P.C.

(57) ABSTRACT

An image acquisition system is disclosed. The image acquisition system includes: an object area configured to form an image on an image side; a condenser lens configured to converge light from the object area, the condenser lens being located on a light path of the object area; a color filter configured to filter the light collected by the condenser lens to obtain single wavelength of light, according to a forward direction of the light, the color filter being placed in front of the condenser lens; and an image sensor configured to receive the image on an imaging plane position of an image space, the image sensor being placed in front of the imaging plane position according to the forward direction of the light. The matrix image acquisition system and the matrix image projection system including the image acquisition system are also disclosed.

20 Claims, 4 Drawing Sheets

(51) Int. Cl.
*H04N 23/16* (2023.01)
*H04N 23/55* (2023.01)
*H04N 25/76* (2023.01)

(52) U.S. Cl.
CPC ............. *H04N 23/16* (2023.01); *H04N 23/55* (2023.01); *H04N 25/76* (2023.01)

(58) Field of Classification Search
USPC .............................. 348/227.1, 294, 237, 298
See application file for complete search history.

(56) References Cited

U.S. PATENT DOCUMENTS

| | | | |
|---|---|---|---|
| 2005/0128335 | A1 | 6/2005 | Kolehmainen et al. |
| 2008/0030601 | A1 | 2/2008 | Sung et al. |
| 2008/0285965 | A1 | 11/2008 | Feldman et al. |
| 2011/0157451 | A1 | 6/2011 | Chang |
| 2012/0188422 | A1 | 7/2012 | Cho |
| 2016/0295182 | A1 | 10/2016 | Gao et al. |
| 2017/0295296 | A1 | 10/2017 | Yu |

FOREIGN PATENT DOCUMENTS

| | | | | |
|---|---|---|---|---|
| CN | 1544990 | | 11/2004 | |
| CN | 1739287 | | 2/2006 | |
| CN | 1934872 | | 3/2007 | |
| CN | 102118551 | | 7/2011 | |
| CN | 103108191 | | 5/2013 | |
| CN | 203811978 | U | 9/2014 | |
| CN | 106054511 | | 10/2016 | |
| CN | 106803872 | * | 6/2017 | .............. H04M 1/02 |
| CN | 108205233 | | 6/2018 | |
| CN | 108377325 | | 8/2018 | |
| CN | 108663881 | | 10/2018 | |
| CN | 108881701 | | 11/2018 | |
| CN | 208257976 | U | 12/2018 | |
| CN | 109672816 | | 4/2019 | |
| EP | 2315448 | | 4/2011 | |
| GB | 2418486 | * | 11/2004 | .............. H04N 1/00 |
| JP | 2005268909 | | 9/2005 | |
| KR | 100772910 | B1 | 11/2007 | |

OTHER PUBLICATIONS

First Office Action issued for Chinese Patent Application No. 201910007152.7, dated Feb. 3, 2020, 15 pages including English translation.

Second Office Action issued for Chinese Patent Application No. 201910007152.7, dated Oct. 9, 2020, 17 pages including English translation.

International Search Report issued for International Patent Application No. PCT/CN2019/093782, dated Sep. 26, 2019, 6 pages including English translation.

Supplementary Search Report issued for Chinese Patent Application No. 201910007152.7, dated Jan. 25, 2021, 1 page.

* cited by examiner

IMAGE ACQUISITION SYSTEM, MATRIX IMAGE ACQUISITION SYSTEM AND MATRIX IMAGE PROJECTION SYSTEM

CROSS REFERENCES TO RELATED APPLICATIONS

The present application is a continuation application of International Application No. PCT/CN2019/093782 filed on Jun. 28, 2019, which claims priority to Chinese patent application No. 201910007152.7, filed on Jan. 4, 2019. Both applications are incorporated herein by reference in their entireties.

TECHNICAL FIELD

The present disclosure relates to the technical field of optical imaging, in particular to an image acquisition system, a matrix image acquisition system, and a matrix image projection system.

BACKGROUND

An image acquisition system is an indispensable component in machine vision, and it determines the quality of imaging of an optical lens. With the continuous development of optical imaging, the design of image acquisition system has been gradually improved.

When the conventional image acquisition system is applied to a camera lens, it can provide the camera lens with multi-pixel imaging effect, and it usually adopts the working mode of Bayer matrix based color filter solution, such as an RGBG matrix, an RGBE matrix, or an RGBW matrix, or other color-filtering solutions. Four monochromatic pixel units are combined into a color pixel unit to complete the color imaging of the image by the camera lens.

However, due to the inherent working principle of the Bayer matrix, when the image acquisition system based on Bayer matrix working mode is applied to the camera lens, the resolution of the image collected by the image acquisition system is greatly reduced. For example, an image of 1 million monochrome pixels becomes an image of 250,000 colored pixels after being filtered by the matrix of RGBG, RGBE or RGBW. Moreover, it is also necessary to eliminate the chromatic aberration of the synthesized low-resolution image, which means that more optical lenses need to be used, resulting in a larger system volume and an increase in manufacturing cost.

Therefore, the conventional image acquisition system has the problem of high image acquisition cost.

SUMMARY

Based on this, it is necessary to provide an image acquisition system, a matrix image acquisition system, and a matrix image projection system to solve the problem of high image acquisition cost in the conventional image acquisition system.

An image acquisition system includes:
an object area configured to form an image on an image side;
a condenser lens configured to converge light from the object area, the condenser lens being located on a light path of the object area;
a color filter, configured to filter light collected by condenser lens to obtain single wavelength of light, according to a forward direction of light, the color filter being placed in front of the condenser lens; and
an image sensor configured to receive the image on an imaging plane position of an image space, the image sensor being placed in front of the imaging plane position according to the forward direction of light.

In the image acquisition system provided by the present disclosure, by using the color filter and the image sensor to receive the monochrome image, a solution that can form a colored image by superimposing a plurality of monochrome images when the image acquisition systems is arranged in a matrix, thereby obtaining the image without chromatic aberration, which omits the lens placed for achromatic aberration, simplifies the design of the system, and reduces the size of the system, and the image resolution will not be reduced, thereby greatly reducing the cost of the image acquisition system.

In an embodiment, the image sensor is a CMOS image sensor.

In an embodiment, the condenser lens is a thin condenser lens.

In an embodiment, a matrix image acquisition system is provided, which includes the image acquisition system according to any one of the above first to third embodiments. The condenser lens includes at least one set of condenser lens, and correspondingly, the color filter includes at least one set of color filter, and the image sensor includes at least one set of image sensor.

In an embodiment, a matrix image acquisition system is provided, in which the condenser lens includes two sets of condenser lenses, and correspondingly, the color filter includes two sets of color filters, and the image sensor includes two sets of image sensors.

In an embodiment, a matrix image acquisition system is provided, in which a distance between the condenser lens and the imaging plane position is an image-side focal length $L_i$ of the image acquisition system, a distance between the condenser lens and the object area of an object space is an object-side focal length $L_p$ of the image acquisition system, and when $L_i$=4.54 mm, $L_p$≥300 mm.

In an embodiment, a matrix image acquisition system is provided, in which the color filter is integrated with the condenser lens and/or the image sensor.

In an embodiment, a matrix image acquisition system is provided, in which the image-side image on the imaging plane position has an eccentricity value, the eccentricity value is denoted as $\delta_n$, a spacing of adjacent condenser lenses is D, and $\delta_n = K \times n \times D \times (L_i \div L_p)$, where n≥0, the K value is used to indicate the degree of influence of a condenser lens thickness on the eccentricity value, K is determined by the optical parameters of the matrix image acquisition system.

In an embodiment, a matrix image acquisition system is provided, and the matrix image acquisition system further includes a supporting device. The supporting device is configured to hold the condenser lenses and/or the image sensors in order to make offsets of the condenser lenses and/or the image sensors consistent with the requirements of the eccentricity value $\delta_n$.

In an embodiment, a matrix image projection system is provided, which includes a light source, a reflecting mirror, a display screen, and the matrix image acquisition system according to any one of the above fourth to ninth embodiments. The display screen is placed at a position of the image sensor, and the reflecting mirror is configured to reflect light from the light source to the display screen.

DETAILED DESCRIPTION OF THE EMBODIMENTS

In order to make the purposes, technical solutions, and advantages of the present disclosure more apparent and understandable, the present disclosure is further described in detail below with reference to the accompanying drawings and embodiments. It should be understood that the specific embodiments illustrated herein are merely for the purpose of explanation, and should not be deemed to limit the present disclosure.

It should be noted that, all terms used herein, including technical and scientific terms, shall have the same meaning as commonly understood by a person skilled in the art to which this application belongs. The terms used in the specification of the present disclosure herein are for the purpose of describing specific embodiments only and are not intended to limit the present disclosure. The term "and/or" used herein includes any and all combinations of one or more of the associated listed items.

Figure 1:
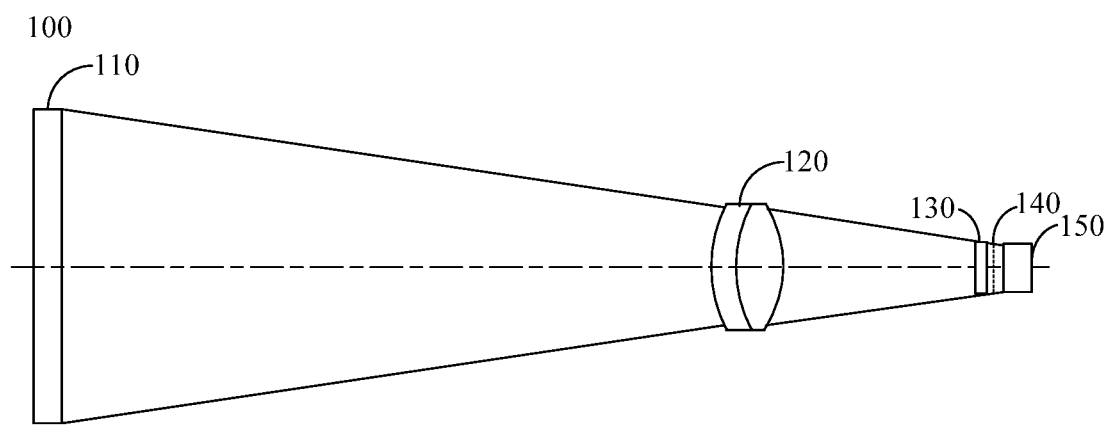
FIG. 1 is a structural diagram illustrating a light path of an image acquisition system in an embodiment.

Referring to FIG. 1, FIG. 1 is a schematic structural diagram illustrating an image acquisition system in an embodiment. In an embodiment, an image acquisition system 100 is provided, and the image acquisition system 100 includes:

an object area 110 in an object space configured to form an image on an image side;

a condenser lens 120 configured to converge light from the object area 110, the condenser lens 120 being located on a light path of the object area 110;

a color filter 130 configured to filter the light collected by the condenser lens 120 to obtain single wavelength of light, according to a forward direction of the light, the color filter 130 being placed in front of the condenser lens 120; and an image sensor 150 configured to receive the image on an imaging plane position 140 of an image space; the image sensor 150 being placed in front of the imaging plane position 140 according to the forward direction of the light.

In the image acquisition system provided by the present disclosure, the condenser lens is used to converge the light beam from the object area, and the color filter is placed in the image space and between the condenser lens and the imaging plane position, the color filter only allows light of a single wavelength to pass through, to obtain, at the imaging plane position, the image on the image side, and the image-side image can be collected by the image sensor. Through the above solution, the monochrome image without chromatic aberration can be received by using the color filter and the image sensor, the lens configured to eliminate achromatic aberration is saved, the system design is simplified, the system size is reduced, and the image resolution will remain high, thereby the cost of the image acquisition system is reduced greatly.

In an embodiment, referring to FIG. 1, the image sensor is a CMOS image sensor.

CMOS (Complementary Metal Oxide Semiconductor) is a photosensitive element, and CMOS image sensor is a typical solid-state imaging sensor, which is usually made of several parts including a row driver, a column driver, a timing control logic, a digital-to-analog converter, a data bus output interface, and a control interface, and these several parts are usually integrated on one same silicon chip. The working principle of the CMOS image sensor is described as below: external light illuminates pixel array to occur photoelectric effect, such that corresponding charge is generated in the pixel units; and the logic unit selects corresponding pixel units according to needs, and image signals in the pixel units are therefore transmitted to a corresponding analog signal processing unit and the digital-to-analog converter through a signal bus where each of the pixel units is located, such that the image signals are converted into digital image signals and are output. Mainly due to the characteristics such as low power consumption, simple manufacturing process and low cost of the CMOS image sensor used in the embodiments of the present disclosure, greatest advantage can be given to the overall performance of the image acquisition system.

Figure 2:
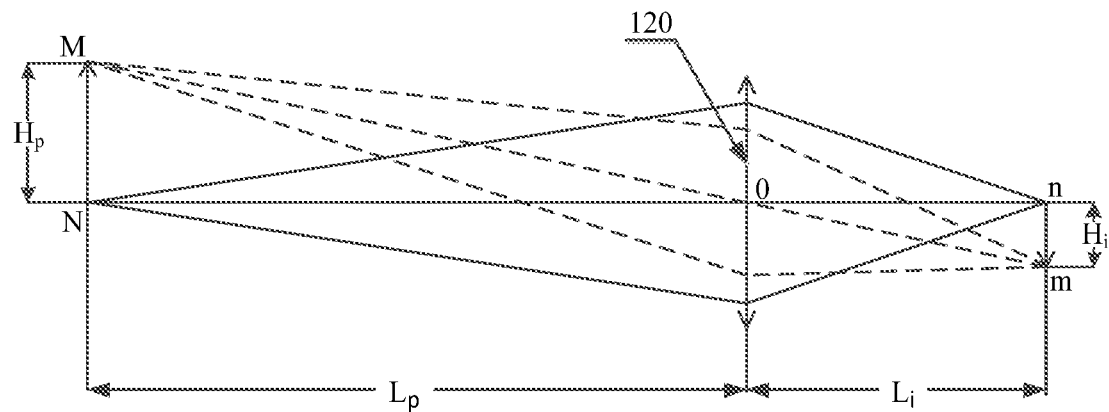
FIG. 2 is a schematic diagram illustrating a light path of an image acquisition system in an embodiment.

Referring to FIG. 2, FIG. 2 is a schematic diagram illustrating a light path of an image acquisition system in an embodiment. In an embodiment, an image acquisition system 100 is provided, which can be described in conjunction with FIG. 1.

The object-side region 110 is denoted as MN in FIG. 2, point M serves as an off-axis point of the condenser lens 120, and point N serves as an on-axis point of the condenser lens 120. The object height of MN is denoted as $H_P$, object MN is imaged by the condenser lens 120 at the image plane position 140 and its image is denoted as mn, and the image height of the image mn is denoted as $H_i$. The light emitted from the point M is refracted by the condenser lens 120 and is then focused on the point m, as shown by the dotted line light path in FIG. 2. The light emitted from the point N is refracted by the condenser lens 120 and is then focused on the point n, as shown by the solid line light path in FIG. 2. Therefore, after the light of the MN is refracted by the condenser lens 120, its image mn is not coaxial with the condenser lens 120. Specifically, the image sensor is not coaxial with the condenser lens in the embodiments of the present disclosure.

Figure 3:
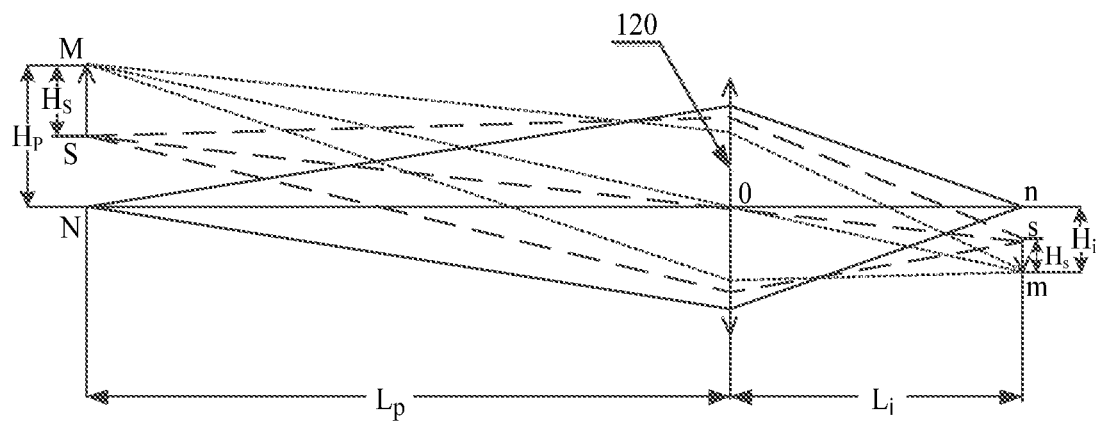
FIG. 3 is a schematic diagram illustrating a light path of an image acquisition system in another embodiment.

Referring to FIG. 3, FIG. 3 is a schematic diagram illustrating a light path of an image acquisition system in another embodiment. In an embodiment, an image acquisition system 100 is provided, which can be described in conjunction with FIG. 1 and FIG. 2.

The light path schematic diagram shown in FIG. 3 not only has the parameters in FIG. 2, but further has another off-axis point S of the condenser lens 120. As shown, the point S serves as an off-axis point of the condenser lens 120. The object height of MS is denoted as $H_S$, accordingly object MS is imaged by the condenser lens 120 at the image plane position 140, its image is denoted as ms, and the image height of the image ms is denoted as $H_s$. The light emitted from the point S is refracted by the condenser lens 120 and is then focused on the point s. Therefore, the light of the MS is refracted by the condenser lens 120, its image ms is not coaxial with the condenser lens 120, and the image ms deviates from the axis of the condenser lens 120 by a distance denoted as sn. More specifically, the image sensor is not coaxial with the condenser lens in the embodiments of the present disclosure.

In an embodiment, the condenser lens is a thin condenser lens.

Preferably, the condenser lens 120 proposed in the present disclosure may be a thin condenser lens, so as to eliminate the aberration caused by the thickness of the lens to the image acquisition system 100. The optical parameters, such as the thickness of the thin condenser lens, shall be subject to the parameter settings such as the object-side focal length, the image-side focal length, and lens spacing in the practical production of the image acquisition system 100. In another embodiment, the condenser lens 120 may also be a condenser lens made of a plurality of lenses, so as to optimize the imaging effect of the image acquisition system.

In an embodiment, a matrix image acquisition system is provided, in which the condenser lens includes at least one set of condenser lens, correspondingly, the color filter includes at least one set of color filter, and the image sensor includes at least one set of image sensor.

Specifically, the matrix image acquisition system is a permutation combination of the image acquisition systems. In practical applications, in order to obtain a colored full-color gamut image, it is necessary to assemble a plurality of sets of image acquisition systems, that is, a matrix image acquisition system includes a plurality of sets of condenser lenses, a plurality of sets of corresponding color filters, and a plurality of sets of image sensors. The present disclosure proposes to provide a color filter in the image acquisition system so that the emergent light after passing through the color filter is monochromatic light with a single same wavelength, thereby obtaining a monochrome image. In this case, the matrix image acquisition system can obtain a colored image by superposing a plurality of monochrome images without eliminating the chromatic aberration. In practical applications, in order to obtain a multi-color gamut image, a plurality of image acquisition systems are superimposed, so that the monochrome images are integrated by the image sensors to generate a full-color gamut image. The subdivision of the image color depends on the number of types of image sensors and color filters, and is no longer limited to the color filtering of the conventional RGBG, RGBE or RGBW color filters.

In the above solution, since the image sensor is only used in the monochromatic light environment in this embodiment, the resolution of the colored image of the matrix image acquisition system is the sum of the resolutions of all the monochrome images, not a quarter of the total resolution of the conventional image acquisition system. The colored image resolution is greatly improved and there is no need to eliminate the achromatic aberration of the colored image.

Figure 4:
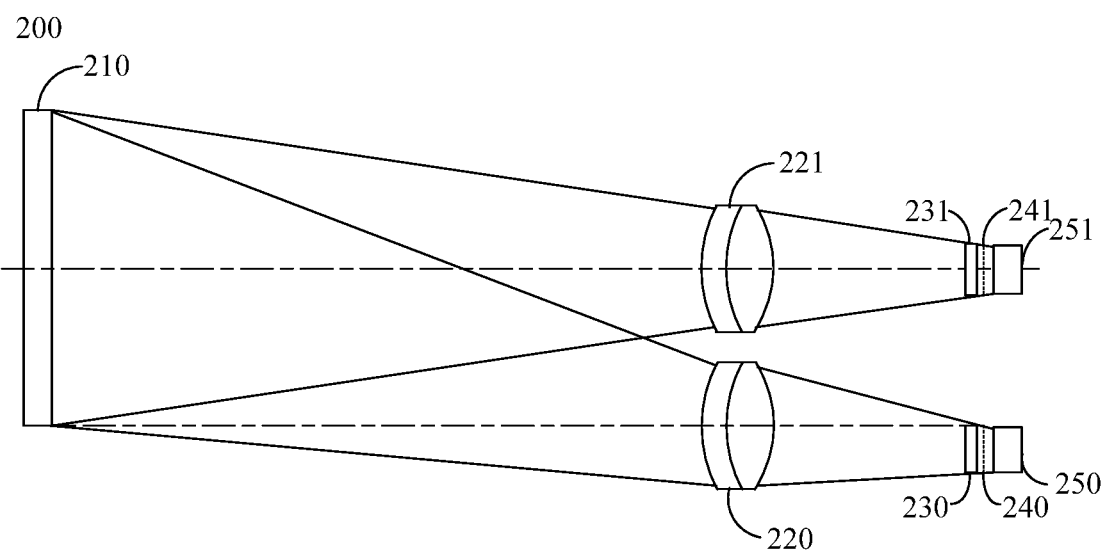
FIG. 4 is a structural diagram illustrating a light path of a matrix image acquisition system in an embodiment.

Referring to FIG. 4, FIG. 4 is a structural diagram illustrating a light path of a matrix image acquisition system in an embodiment. In an embodiment, a matrix image acquisition system 200 is provided, in which the condenser lens includes two sets of condenser lenses, and correspondingly, the color filter includes two sets of color filters, and the image sensor includes two sets of image sensors.

In order to further explain the structure of the matrix image acquisition system, a matrix image acquisition system 200 including only two sets of condenser lenses, two sets of color filters, and two sets of image sensors is proposed. As shown in FIG. 4, the matrix image acquisition system 200 includes two sets of image acquisition systems. The first set of image acquisition system includes: an object area 210, a condenser lens 220, a color filter 230, an imaging plane position 240, and an image sensor 250. The second set of image acquisition systems includes: an object area 210, a condenser lens 221, a color filter 231, an imaging plane position 241, and an image sensor 251.

Specifically, in order to study the imaging difference between the two sets of image acquisition systems, the two sets of image acquisition systems are provided to share one same object area 210. The center of the first set of image acquisition system is not coaxial with the center of the object area 210, the center of the object area 210 is located above the axis of the condenser lens 220, while the center of the generated image at the imaging plane position 240 is located below the axis of the condenser lens 220, and the image at the imaging plane position 240 is imaged upside down relative to the object area 210, which can be further expressed as that the condenser lens 220 and the image sensor 250 in the first set of image acquisition system are provided non-coaxially. The center of the second set of image acquisition system is coaxial with the center of the object area 210, the center of the object area 210, the center of the condenser lens 221, and the center of the generated image at the imaging plane position 241 are collinear and are located on the axis of the condenser lens 221, and the image at the imaging plane position 241 is imaged upside down relative to the object area 210, which can be further expressed as that the condenser lens 220 and the image sensor 250 in the second set of image acquisition system are provided coaxially.

Therefore, in practical applications, when the image sensors are placed in the matrix image acquisition system, the image-side images received by the image sensors may be located at different pixel unit positions. In order to make the image-side images received by the plurality of image sensors capable of being superimposed indiscriminately, it is necessary to make the pixel unit positions of the images received by the image sensors consistent. That is, the receiving directions of the image sensors must be adjusted in practical applications so that the image-side images of the object-side region 210 can be completely overlapped.

In the matrix image acquisition system provided by the present disclosure, the plurality of sets of image acquisition systems are used to receive the plurality of sets of monochrome images, and the monochrome images are further integrated to obtain a colored image, so that the colored image can be obtained without eliminating the image chromatic aberration, which further simplifies the design of the system and reduces the number of lenses used to eliminate the chromatic aberration, thereby reducing the size of the system and reducing the manufacturing cost of the system.

Figure 5:
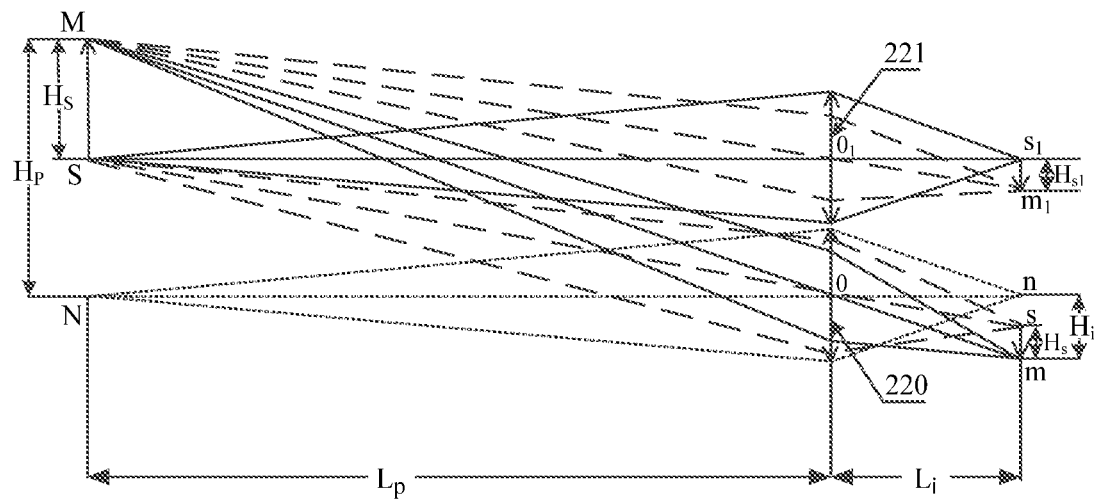
FIG. 5 is a schematic diagram illustrating a light path of a matrix image acquisition system in an embodiment.

Referring to FIG. 5, FIG. 5 is a schematic diagram illustrating a light path of a matrix image acquisition system in an embodiment. In an embodiment, a matrix image acquisition system 200 is provided, which can be described in conjunction with the matrix image acquisition system described in FIG. 4. The distance between the condenser lens and the imaging plane position is an image-side focal length of the image acquisition system, and it is denoted as $L_i$. The distance between the condenser lens and the object-side region is an object-side focal length $L_p$ of the image acquisition system, and it is denoted as $L_p$. When $L_i$=4.54 mm, $L_p$≥300 mm.

Specifically, in practical applications, in order to make the sizes of the image-side images received by the image sensors equal, it is necessary to consider increasing the difference between the object-side focal length and the image-side focal length in the system as much as possible, so that the differences among image heights can be reduced. In a specific embodiment, if the image-side focal length $L_i$=4.54 mm, and $L_p$≥300 mm, under this condition the object-side focal length is nearly 67 times of the image-side focal length, which can meet the aberration condition and the control of the system size to the greatest extent.

Figure 6:
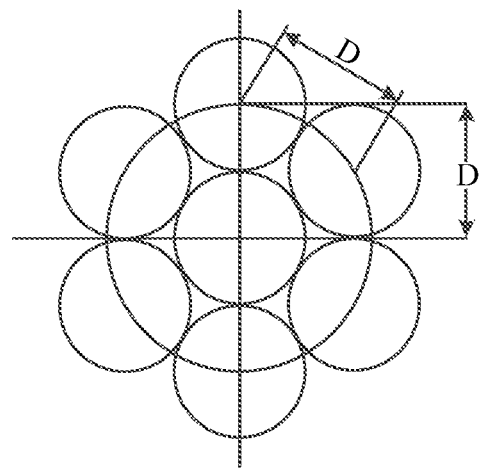
FIG. 6 is a layout plan view of a condenser lens matrix in an embodiment.

Referring to FIG. 6, FIG. 6 is a layout plan view of a matrix condenser lens in an embodiment. In an embodiment, a matrix image acquisition system is provided, in which when there are 7 sets of the condenser lens, the condenser matrix can be arranged in a regular hexagon.

In a matrix image acquisition system, if there are 7 sets of the image acquisition system, including 7 sets of condenser lens, then condenser matrix is arranged as shown in FIG. 6, the center distance between the two adjacent condenser lenses is denoted as D, then the color filters and the image sensors are also arranged at equal intervals as shown in FIG. 6, corresponding to the condenser lenses one by one. In another embodiment, if there are 37 sets of image acquisition system, that is, when the number of condenser lenses is 37, all condenser lenses can be arranged in a regular hexagon.

However, in practical applications, when the number of condenser lenses is greater than 1, the condenser lenses may also be arranged in other patterns, such as in a square, rectangle, or the like. It can be seen that people skilled in the art can arrange the condenser lenses in a variety of patterns, and the embodiments of the present disclosure do not limit the specific arrangement of the condenser lenses.

In an embodiment, a matrix image acquisition system is provided, in which the color filter is integrated with the condenser lens and/or the image sensor.

Specifically, the color filter can be fixed on an image receiving surface position of the image sensor, or fixed on a light-exiting surface position of the condenser lens, to ensure that the image sensor can receive the monochrome image which has been processed by the color filter.

In an embodiment, it can be described with reference to FIGS. 4 and 5. The image-side image on the imaging plane position has an eccentricity value. The eccentricity value is denoted as $\delta_n$. The spacing of the condenser lenses is D. $\delta_n = K \times n \times D \times (L_i \div L_p)$, where n≥0. The K value is used to indicate the influence of the thickness of the condenser lens on the eccentricity value. The K is determined according to the optical parameters of the matrix image acquisition system.

Specifically, referring to the light path shown in FIG. 5, in a matrix image acquisition system, there are two sets of image acquisition systems, one is coaxial with the center of the object area 210, and the other one is non-coaxial with the center of the object area 210. In this case, the coaxial one is configured as central set of the matrix image acquisition system, and the non-coaxial one is configured as adjacent set of the central set. It can be seen that, the object MS is imaged in the adjacent set system and its image is ms, and the image height of the image ms is $H_s$, while the object MS is imaged in the central set system and its image is $m_1s_1$ and the image height of the image $m_1s_1$ is denoted as $H_{s1}$. There is a distance SN between the condenser lens 221 and the condenser lens 220, as a result, the image point s of the object point S after imaging through the condenser lens 220 is not on the optical axis of the condenser lens 220, but has a distance sn, and $sn = H_i - H_s$.

Therefore, the present disclosure proposes to have an eccentricity value $\delta_n$ in the matrix image acquisition system. The eccentricity value $\delta_n$ is the distance between the image and the axis of the condenser lens in the image acquisition system. When the spacing of the condenser lenses is D, the eccentricity value of the system $\delta_n = n \times D \times (L_i \div L_p)$, where n≥0, and n represents the number of adjacent of the adjacent set systems relative to the central set system. For example, in FIG. 5, there is one distance SN between the condenser lens 220 of the adjacent set and the condenser lens 221 of the central set, that is, there is only one lens spacing D, so n is equal to 1. $L_i$ represents the image-side focal length of the matrix image acquisition system. $L_p$ represents the object-side focal length of the matrix image acquisition system.

In order to verify that the matrix image acquisition system proposed by the present disclosure has a good imaging effect, in an embodiment, a CMOS image sensor with a minimum pixel unit of 1.75 μm is used. The spacing of the condenser lenses is D=10 mm. The object-side focal length of the matrix image acquisition system is $L_p$=300 mm, and the image-side focal length thereof is $L_i$=4.54 mm, then the object-side focal length is about 67 times of the image-side focal length. In this case, in the matrix image acquisition system having two sets of image acquisition systems, there is a certain aberration between the image height of ms and the image height of $m_1s_1$, which can be expressed with an expression as: $H_s - H_{s1} < \delta_n \div 67$, where $\delta_n = n \times D \times (L_i \div L_p) = 1 \times 10 \times (4.54 \div 300) \approx 0.15$ mm, then $H_s - H_{s1} < 0.15 \div 67$, and then $H_s - H_{s1} < 2.26$ μm is further obtained. The aberration in the system is less than 2.26 μm, which is close to the smallest pixel unit of the CMOS image sensor, and the difference between the aberration 2.26 μm and the smallest pixel unit 1.75 μm is less than the value of one smallest pixel unit, which falls in a reasonable aberration range, therefore, the matrix image acquisition system proposed by the present disclosure has a relatively good imaging effect.

In a practical application, if the thickness of the condenser lens is ignored, the equation for calculating the eccentricity value is: $\delta_n = n \times D \times (L_i \div L_p)$, where n≥0.

However, in practical applications, the condenser lens has a certain thickness, and this thickness value has an influence on the eccentricity value, so in the present disclosure, the influence of the condenser lens thickness on the eccentricity value is set as an influence value K. The equation for calculating the eccentricity value is: $\delta_n = K \times n \times D \times (L_i \div L_p)$, where n≥0.

Specifically, referring to FIG. 5, matrix image acquisition systems set with different parameters will have different K values. To facilitate the calculations, the field of view of the system is set to the object height SN in the simulation software. That is, the specific value of the object height is set as an integer multiple of the condenser lens spacing D, which means that in the matrix image acquisition system, each set of image acquisition system is based on the distance between the axes of the condenser lenses and is configured to have an equal distance between the lens axes of the plurality of condenser lenses. In this case, except for the central set image acquisition system, the image heights sn of the adjacent set image acquisition systems can be expressed in sequence as $sn_1$, $sn_2$, $sn_3$, and the like. In the matrix image acquisition system, the equations for calculating all the eccentric values are: $sn_1 = \delta_1 = K \times 1 \times D \times (L_i \div L_p)$, $sn_2 = \delta_2 = K \times 2 \times D \times (L_i \div L_p)$, $sn_3 = \delta_3 = K \times 3 \times D \times (L_i \div L_p)$, and the like. In this case, different object heights are set in the simulation software to calculate K values correspondingly, as shown in the following table:

| Image height | 0 | D | 2D | 3D | 4D | 5D |
|---|---|---|---|---|---|---|
| Actual image height | 0 | 0.155 | 0.311 | 0.466 | 0.622 | 0.778 |
| Image height of the condenser lens | 0 | 0.151 | 0.303 | 0.454 | 0.605 | 0.757 |
| K value | 1 | 1.025 | 1.026 | 1.027 | 1.028 | 1.028 |

As shown in the above table, with the increase of the number of condenser lenses in the matrix image acquisition system, K value is also gradually increasing. Take the matrix image acquisition system arranged in a regular hexagon as an example, in this case, the matrix of the condenser lenses is arranged as referred to FIG. 6. When the object height in the system is 3D, all of the condenser lenses are arranged in a regular hexagon, and the total number of the condenser lenses is 37, then the K value can be calculated: K=(1.025+ 1.026+1.027)÷3≈1.026. In this case, the eccentricity value with the object height SN relative to the spacing D between the condenser lenses of the central set being less than or equal to 3D can be expressed by the following calculation equation: $\delta_n=1.026 \times n \times D \times (L_i \div L_p)$.

It should be noted that in this case, the eccentricity value of the system with the number of condenser lenses less than or equal to 37 is $\delta_n=1.026 \times n \times D \times (L_i \div L_p)$. Then when n=0, $\delta_n=0$, and when n≤37, $\delta_n=1.026 \times n \times D \times (L_i \div L_p)$. If the optical structure parameters or lens materials of the matrix image acquisition system are relatively adjusted, then the K value may not necessarily be calculated by the above equations, but is based on the actual design of the system.

In an embodiment, a matrix image acquisition system is provided, which can be described with reference to FIG. 5: a supporting device; the supporting device is configured to hold the condenser lenses and/or the image sensors so that the offsets of the condenser lenses and/or the image sensors meet the eccentricity value.

Specifically, referring to FIG. 5, if the image acquisition system where the condenser lens 221 is located is regarded as the central system, the eccentricity value of this central system is 0, and there is no need to move the image-side image $m_1s_1$ of the central system. In this case, the first position of the image-side image $m_1s_1$ coincides with the second position of the image-side image $m_1s_1$. However, the eccentricity value of the adjacent system is $\delta_n=sn$, so it is necessary to move the position of the image-side image ms, and moving distance is the eccentricity value sn, and after moving, the image point s will be located at the central axis of the condenser lens 220. In this case, the supporting device can be configured to support and fix the adjusted condenser lenses and/or image sensors, so that the relative positions between the condenser lenses and/or image sensors can ensure the eccentricity value calculated in the above-described embodiment.

Figure 7:
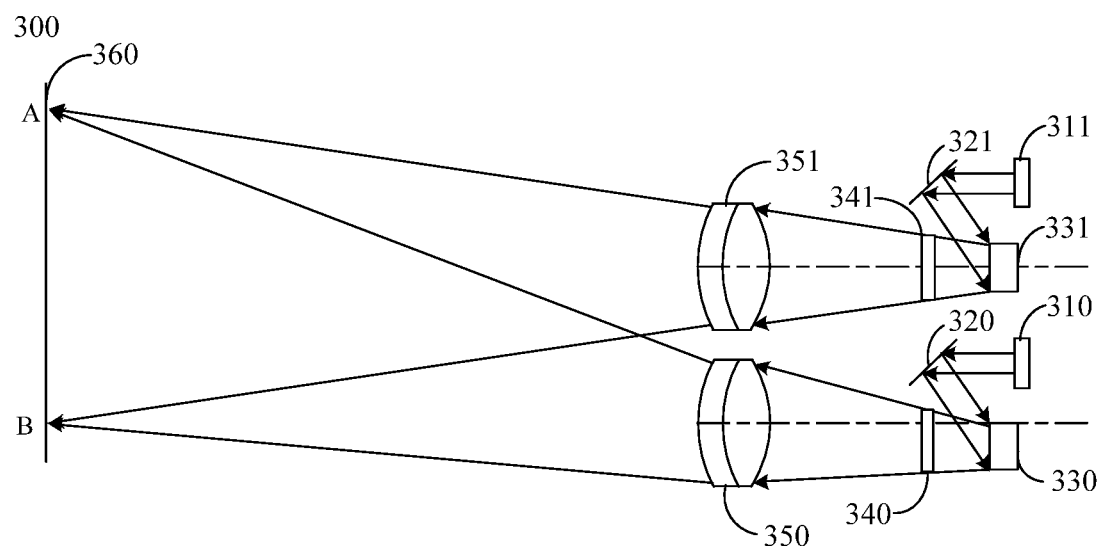
FIG. 7 is a schematic diagram illustrating a light path of a matrix image projection system in an embodiment.

Referring to FIG. 7, FIG. 7 is a schematic diagram illustrating a light path of a matrix image projection system in an embodiment. In an embodiment, a matrix image projection system 300 is provided. With combined reference to FIG. 4, of which one set of image projection system is used for description, including: a light source 310, a reflecting mirror 320, a display screen 330, and the matrix image acquisition system 200 as described in the above embodiments. The display screen 330 is placed at the position of the image sensor 250. The reflecting mirror 320 is configured to reflect light from the light source 310 to the display screen 330.

In the matrix image acquisition system 200 proposed by the present disclosure, the image sensor 250 is replaced with the display screen 330. The display screen 330 may include, for example, a LCD (Liquid Crystal Display), a LCOS (Liquid Crystal on Silicon) or a DMD (Digital Micro mirror Device), or other devices, in the meantime the light source 330 and the mirror 320 are placed to form a set of image projection system. After a plurality of sets of image projection systems are arranged in a matrix, a matrix image projection system as shown in FIG. 7 can be obtained.

Specifically, in the matrix image projection system, after the light emitted by the light source 310 and the light source 311 is reflected by the reflecting mirror 320 and the reflecting mirror 321, the reflected light is received and processed by the display screen 330 and the display screen 331, and is further color-filtering processed by the color filter 341 and the color filter 340 to become outgoing single wavelength light. The monochromatic light goes forward and passes through the condenser lenses 351 and 350, and is finally imaged at the imaging plane position 360. The height of the image-side image is shown by the distance between the points A and B.

It should be noted that, in the embodiments of the present disclosure, the matrix of the condenser lenses and the matrix of the display screens are designed to make the images of the plurality of image projection systems capable of being finally completely overlapped at the imaging plane position 360, it is necessary to appropriately adjust the relationship between the condenser lens matrix and the display screen matrix. As shown in FIG. 7, the individuals of the condenser lens matrix and of the display screen matrix are placed non-coaxially, that is, the spacing of the condenser lens individuals in the matrix is inconsistent with the spacing of the display screens, so that the emergent light that has been focused by the condenser lenses can coincide without aberration at the imaging plane position 360.

The technical features of the above embodiments may be combined freely. To simplify the description, not all possible combinations of the technical features in the above embodiments are described, however, all of the combinations of these technical features should be considered as within the scope of this application, as long as such combinations do not contradict with each other. The above-described embodiments are merely illustrative of several embodiments of the present disclosure, which are described specifically and in detail, but they cannot be understood as limiting the scope of the present disclosure. It should be noted that, for those ordinary skilled in the art, several variations and improvements may be made without departing from the concepts of the present disclosure, and these variations and improvements are all within the protection scope of the present disclosure. Therefore, the scope of protection of the present disclosure shall be subject to the appended claims.

What is claimed is:

1. A matrix image acquisition system, comprising at least two image acquisition systems, wherein each of the at least two image acquisition systems comprises:
   an object area configured to form an image on an image side;
   a condenser lens configured to converge light from the object area, the condenser lens being located on a light path of the object area;
   a color filter configured to filter the light collected by the condenser lens to obtain single wavelength of light, the color filter being placed in front of the condenser lens according to a forward direction of the light; and
   an image sensor configured to receive an image-side on an imaging plane position of an image space, the image sensor being placed in front of the imaging plane position according to the forward direction of the light,
   wherein the image-side image on the imaging plane position has an eccentricity value, the eccentricity value is $\delta_n$, and $\delta_n=K \times n \times D \times (L_i \div L_p)$, where n≥0, a distance between the condenser lens and the imaging plane position is an image-side focal length $L_i$ of the image acquisition system, a distance between the condenser lens and the object-side region is an object-side focal length $L_p$ of the image acquisition system, the D is a distance between condenser lenses in the at least two image acquisition systems, the K is used to indicate an influence of a condenser lens thickness on the eccentricity value and is determined according to optical parameters of the matrix image acquisition system, and the n is an integer multiple of an object height of the image acquisition system relative to the spacing D between the condenser lenses.

2. The matrix image acquisition system according to claim 1, wherein the image sensor is a CMOS image sensor.

3. The matrix image acquisition system according to claim 1, wherein the condenser lens is a thin condenser lens.

4. The matrix image acquisition system according to claim 1, wherein for each of the at least two image acquisition systems, a distance between the condenser lens and the imaging plane position is an image-side focal length $L_i$ of the image acquisition system, a distance between the condenser lens and the object-side region is an object-side focal length $L_p$ of the image acquisition system, and when $L_i$=4.54 mm, $L_p$≥300 mm.

5. The matrix image acquisition system according to claim 1, wherein the color filter is integrated with the condenser lens and/or the image sensor.

6. The matrix image acquisition system according to claim 1, further comprising a supporting device configured to support the condenser lens and/or the image sensor such that offsets of the condenser lens and/or the image sensor satisfy the eccentricity value.

7. The matrix image acquisition system according to claim 1,
wherein the at least two image acquisition systems comprises a central image acquisition system and an adjacent image acquisition system, the condenser lens and the image sensor in the central image acquisition system are arranged coaxially, and the condenser lens and the image sensor in the adjacent image acquisition system are arranged non-coaxially.

8. The matrix image acquisition system according to claim 4, wherein when $L_i$=4.54 mm, and $L_p$≥300 mm.

9. The matrix image acquisition system according to claim 1, wherein the eccentricity value $\delta_n$ is a distance between the image-side image and an axis of the condenser lens in each image acquisition system.

10. A matrix image projection system, comprising a light source, a reflecting mirror, a display screen, and the matrix image acquisition system according to claim 1, wherein the display screen is placed at a position of the image sensor, and the reflecting mirror is configured to reflect light from the light source to the display screen.

11. The matrix image projection system according to claim 10, wherein the display screen is configured to reflect the light from the light source to the object-side region.

12. A matrix image acquisition system, comprising at least two image acquisition systems,
wherein each of the at least two sets of image acquisition systems comprises:
an object area configured to form an image on an image side;
a condenser lens configured to converge light from the object area, the condenser lens being located on a light path of the object area;
a color filter configured to filter the light collected by the condenser lens to obtain single wavelength of light, the color filter being placed in front of the condenser lens according to a forward direction of the light; and
an image sensor configured to receive an image-side on an imaging plane position of an image space, the image sensor being placed in front of the imaging plane position according to the forward direction of the light;
wherein the at least two image acquisition system comprises a central image acquisition system and at least one adjacent image acquisition system, the condenser lens and the image sensor in the central image acquisition system are arranged coaxially, and the condenser lens and the image sensor in the adjacent image acquisition system are arranged non-coaxially;
wherein the image-side image on the imaging plane position in each set of image acquisition system has an eccentricity value, the eccentricity value is a distance between the image-side image and an axis of the condenser lens in each image acquisition system, the eccentricity value is $\delta_n$, and $\delta_n = K \times n \times D \times (L_i \div L_p)$, where n≥0; and
wherein a distance between the condenser lens and the imaging plane position is an image-side focal length $L_i$ of the image acquisition system, a distance between the condenser lens and the object-side region is an object-side focal length $L_p$ of the image acquisition system, the D is a distance between a condenser lens in each adjacent image acquisition systems and a condenser lens in the central image acquisition system, the K value is used to indicate an influence of a thickness of the condenser lens on the eccentricity value, the K is determined according to optical parameters of the matrix image acquisition system, and the n is an integer multiple of an object height of the image acquisition system relative to the distance D between the condenser lenses.

13. The matrix image acquisition system according to claim 12, wherein for each of the at least two image acquisition systems, a distance between the condenser lens and the imaging plane position is an image-side focal length $L_i$ of the image acquisition system, a distance between the condenser lens and the object-side region is an object-side focal length $L_p$ of the image acquisition system, and when $L_i$=4.54 mm, $L_p$≥300 mm.

14. The matrix image acquisition system according to claim 12, wherein the color filter is integrated with the condenser lens and/or the image sensor.

15. The matrix image acquisition system according to claim 12, further comprising a supporting device configured to support the condenser lens and/or the image sensor such that offsets of the condenser lens and/or the image sensor satisfy the eccentricity value.

16. A matrix image acquisition system having at least one image acquisition system, the image acquisition system comprising:
an object area configured to form an image on an image side;
a condenser lens configured to converge light from the object area, the condenser lens being located on a light path of the object area;
a color filter configured to filter the light collected by the condenser lens to obtain single wavelength of light, the color filter being placed in front of the condenser lens according to a forward direction of the light; and
an image sensor configured to receive an image-side on an imaging plane position of an image space, the image sensor being placed in front of the imaging plane position according to the forward direction of the light,
wherein a distance between the condenser lens and the imaging plane position is an image-side focal length $L_i$ of the image acquisition system, a distance between the condenser lens and the object-side region is an object-side focal length $L_p$ of the image acquisition system, and when $L_i$=4.54 mm, $L_p$≥300 mm.

17. The matrix image acquisition system according to claim 16, wherein the at least one image acquisition system comprises a central image acquisition system and an adjacent image acquisition system, the condenser lens and the image sensor in the central image acquisition system are arranged coaxially, and the condenser lens and the image sensor in the adjacent image acquisition system are arranged non-coaxially.

18. The matrix image acquisition system according to claim 17, wherein the image-side image on the imaging plane position in each image acquisition system has an eccentricity value, the eccentricity value is $\delta_n$, and $\delta_n$=K× n×D×($L_i$÷$L_p$), where n≥0, a distance between the condenser lens and the imaging plane position is an image-side focal length $L_i$ of the image acquisition system, a distance between the condenser lens and the object-side region is an object-side focal length $L_p$ of the image acquisition system, the D is a distance between the condenser lens in the central image acquisition system and the condenser lens in the adjacent image acquisition system, the K is used to indicate an influence of a condenser lens thickness on the eccentricity value and is determined according to optical parameters of the matrix image acquisition system, and the n is an integer multiple of an object height of the image acquisition system relative to the spacing D between the condenser lenses.

19. The matrix image acquisition system according to claim 16, wherein the color filter is integrated with the condenser lens and/or the image sensor.

20. The matrix image acquisition system according to claim 16, further comprising a supporting device configured to support the condenser lens and/or the image sensor such that offsets of the condenser lens and/or the image sensor satisfy the eccentricity value.

* * * * *